United States Patent
Huang et al.

(10) Patent No.: US 12,504,323 B2
(45) Date of Patent: Dec. 23, 2025

(54) ELECTRONIC DEVICE AND RELATED TILED ELECTRONIC DEVICE

(71) Applicant: InnoLux Corporation, Miao-Li County (TW)

(72) Inventors: Yu-Chia Huang, Miao-Li County (TW); Ju-Li Wang, Miao-Li County (TW); Nai-Fang Hsu, Miao-Li County (TW); Cheng-Chi Wang, Miao-Li County (TW); Jui-Jen Yueh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 536 days.

(21) Appl. No.: 17/980,562

(22) Filed: Nov. 4, 2022

(65) Prior Publication Data
US 2024/0102853 A1    Mar. 28, 2024

(30) Foreign Application Priority Data
Sep. 22, 2022 (CN) .......................... 202211155598.2

(51) Int. Cl.
*G01J 1/04* (2006.01)
(52) U.S. Cl.
CPC ........... *G01J 1/0437* (2013.01); *G01J 1/0411* (2013.01)
(58) Field of Classification Search
CPC .... G01J 1/00; G01J 1/02; G01J 1/0204; G01J 1/0209; G01J 1/0214; G01J 1/04; G01J 1/0407; G01J 1/0411; G01J 1/0433; G01J 1/0437; H01L 23/538; H01L 23/5386; H01L 23/5389; H01L 25/03; H01L 25/04; H01L 25/075; H01L 25/0753; H01L 25/16; H01L 25/167; H01L 25/18
See application file for complete search history.

(56) References Cited

U.S. PATENT DOCUMENTS

| | | | | |
|---|---|---|---|---|
| 8,115,293 B2* | 2/2012 | Moon | ................ | H01L 25/0657 257/723 |
| 8,791,404 B2* | 7/2014 | Kerness | ................ | H10F 39/024 250/226 |
| 8,884,431 B2* | 11/2014 | Lin | ................... | H01L 23/49816 257/738 |
| 9,443,835 B2* | 9/2016 | Krabe | ..................... | H10F 55/25 |
| 10,216,975 B1* | 2/2019 | He | ........................ | H10K 59/879 |
| 10,510,718 B2* | 12/2019 | Chen | .................. | H01L 23/5385 |
| 10,546,846 B2* | 1/2020 | Lowes | ....................... | F21K 9/64 |

(Continued)

FOREIGN PATENT DOCUMENTS

| CN | 110870066 A | 3/2020 |
|---|---|---|
| CN | 112271176 A | 1/2021 |

(Continued)

*Primary Examiner* — Georgia Y Epps
(74) *Attorney, Agent, or Firm* — Winston Hsu

(57) ABSTRACT

An electronic device and a related tiled electronic device are disclosed. The electronic device includes a protective layer, a circuit structure, a sensing element and a control unit. The circuit structure is disposed on the protective layer and surrounds the sensing element. The control unit is disposed between the circuit structure and the protective layer and electrically connected to the sensing element. The protective layer surrounds the control unit and contacts a surface of the circuit structure.

19 Claims, 7 Drawing Sheets

(56) References Cited

U.S. PATENT DOCUMENTS

| | | | |
|---|---|---|---|
| 10,672,937 B2* | 6/2020 | Shen | H10F 77/933 |
| 10,692,917 B2* | 6/2020 | Tu | H01L 24/49 |
| 10,777,430 B2* | 9/2020 | Yu | H01L 21/561 |
| 10,796,128 B2* | 10/2020 | Fomani | G06V 40/1318 |
| 10,890,491 B2* | 1/2021 | Valouch | H10F 77/126 |
| 10,910,507 B2* | 2/2021 | Huang | H10F 77/50 |
| 10,930,802 B2* | 2/2021 | Liu | H01L 23/3121 |
| 10,955,343 B2* | 3/2021 | Cai | H10F 77/334 |
| 11,133,423 B2* | 9/2021 | Tsai | H01L 25/162 |
| 11,309,296 B2* | 4/2022 | Lin | H01L 23/49816 |
| 11,373,432 B2* | 6/2022 | Lius | G06V 40/1318 |
| 11,552,053 B2* | 1/2023 | Kani | H01L 24/19 |
| 11,557,701 B2* | 1/2023 | Chen | H10H 20/8506 |
| 11,651,976 B2* | 5/2023 | Renjan | H01L 21/561 |
| | | | 257/676 |
| 11,694,470 B2* | 7/2023 | Lius | G02F 1/13312 |
| | | | 382/124 |
| 12,125,308 B2* | 10/2024 | Lius | G02F 1/13338 |
| 2011/0133325 A1* | 6/2011 | Moon | H01L 24/16 |
| | | | 257/E21.511 |
| 2012/0187280 A1* | 7/2012 | Kerness | H10F 39/107 |
| | | | 257/E31.127 |
| 2016/0163681 A1* | 6/2016 | Lee | H10F 77/93 |
| | | | 257/432 |
| 2019/0019834 A1* | 1/2019 | Tu | H01L 24/48 |
| 2020/0012146 A1* | 1/2020 | Lin | G02B 5/3058 |
| 2021/0081638 A1* | 3/2021 | Lius | G02F 1/133512 |
| 2021/0090908 A1 | 3/2021 | Renjan | |
| 2021/0210662 A1 | 7/2021 | Chiang | |
| 2021/0335764 A1 | 10/2021 | Chen | |
| 2021/0375833 A1 | 12/2021 | Lee | |
| 2021/0398934 A1* | 12/2021 | Hsin | H01L 23/49833 |
| 2021/0405313 A1 | 12/2021 | Kani | |
| 2022/0059510 A1 | 2/2022 | Su | |
| 2022/0238425 A1* | 7/2022 | Hsu | H01L 23/49811 |
| 2022/0292870 A1* | 9/2022 | Lius | G06V 40/1318 |
| 2023/0298380 A1* | 9/2023 | Lius | G02F 1/13312 |
| | | | 382/124 |
| 2023/0386865 A1* | 11/2023 | Renjan | H01L 25/0655 |
| 2024/0102853 A1* | 3/2024 | Huang | G01J 1/0411 |
| 2025/0014383 A1* | 1/2025 | Lius | G02F 1/133512 |

FOREIGN PATENT DOCUMENTS

| | | |
|---|---|---|
| CN | 113571494 A | 10/2021 |
| CN | 114740994 A | 7/2022 |
| TW | 202010140 A | 3/2020 |
| WO | 2021/056826 A1 | 4/2021 |

* cited by examiner

ELECTRONIC DEVICE AND RELATED TILED ELECTRONIC DEVICE

BACKGROUND OF THE DISCLOSURE

1. Field of the Disclosure

The present disclosure relates to an electronic device and a related tiled electronic device, and more particularly to an electronic device including a circuit structure and a sensing element.

2. Description of the Prior Art

In recent years, due to the miniaturization and high density of electronic elements in electronic devices, various packaging technologies of electronic elements have been developed. The manufacturers still keep on researching and developing new electronic devices for optimizing the packaging technology of integrating electronic elements, and have higher expectations for more diversified functions of products.

SUMMARY OF THE DISCLOSURE

One of the objectives of the present disclosure is to provide an electronic device and a related tiled electronic device, the circuit structure and the sensing element may be integrated through the configuration and design thereof, so that the elements with various functions may be integrated in the electronic device, thereby improving the configuration and space design of each element for the electronic device or the tiled electronic device.

An embodiment of the present disclosure provides an electronic device. The electronic device includes a protective layer, a circuit structure, a sensing element and a control unit. The circuit structure is disposed on the protective layer and surrounds the sensing element. The control unit is disposed between the circuit structure and the protective layer and electrically connected to the sensing element. The protective layer surrounds the control unit and contacts a surface of the circuit structure.

An embodiment of the present disclosure provides a tiled electronic device. The tiled electronic device includes two electronic devices and a connection unit. The two electronic devices are disposed adjacent to each other, and each of the electronic devices includes a protective layer, a circuit structure, a sensing element and a control unit. The circuit structure is disposed on the protective layer and surrounds the sensing element. The control unit is disposed between the circuit structure and the protective layer and electrically connected to the sensing element. The protective layer surrounds the control unit and contacts a surface of the circuit structure. The connection unit is disposed on one side of the circuit structure of each of the two electronic devices and electrically connected to the circuit structures of the two electronic devices.

These and other objectives of the present disclosure will no doubt become obvious to those of ordinary skill in the art after reading the following detailed description of the embodiment that is illustrated in the various figures and drawings.

DETAILED DESCRIPTION

Figure 1:
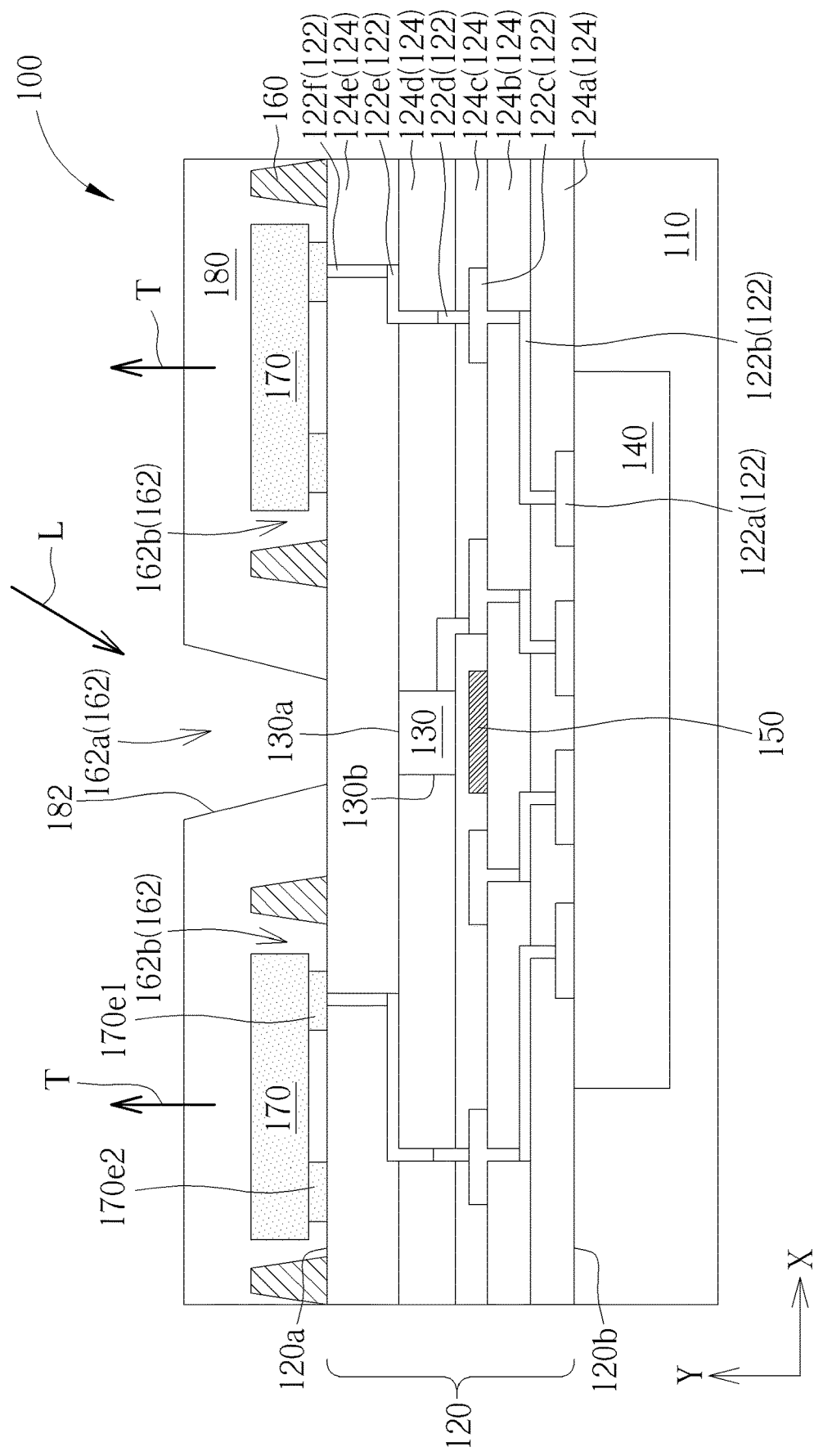
FIG. 1 is a partial cross-sectional schematic diagram of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". When the terms "include", "comprise" and/or "have" are used in the description of the present disclosure, the corresponding features, areas, steps, operations and/or components would be pointed to existence, but not limited to the existence or addition of one or a plurality of the corresponding or other features, areas, steps, operations, components and/or combinations thereof.

When an element or layer is referred to as being "on" or "connected to" another element or layer, it may be directly on or directly connected to the other element or layer, or intervening elements or layers may be presented (indirect condition). In contrast, when an element is referred to as being "directly on" or "directly connected to" another element or layer, there are no intervening elements or layers presented.

The directional terms mentioned in this document, such as "up", "down", "front", "back", "left", "right", etc., are only directions referring to the drawings. Therefore, the directional terms used are for illustration, not for limitation of the present disclosure.

The terms "about", "equal", "identical" or "the same", and "substantially" or "approximately" mentioned in this document generally mean being within 20% of a given value or range, or being within 10%, 5%, 3%, 2%, 1% or 0.5% of a given value or range.

The ordinal numbers used in the description and claims, such as "first", "second", "third", etc., are used to describe elements, but they do not mean and represent that the element(s) have any previous ordinal numbers, nor do they represent the order of one element and another element, or the order of manufacturing methods. The ordinal numbers are used only to clearly discriminate an element with a certain name from another element with the same name. The claims and the description may not use the same terms. Accordingly, in the following description, a first constituent element may be a second constituent element in a claim.

The electronic device of the present disclosure may include a semiconductor device, a package device, a display device, a light-emitting device, a backlight device, a solar cell, a sensing device, an antenna device, a vehicle device, or a high-frequency device, but not limited herein. The electronic device may include a bendable or flexible electronic device. The display device may include a non-self-emissive display device or a self-emissive display device. The antenna device may include a liquid-crystal type antenna device or an antenna device other than liquid-crystal type, and the sensing device may include a sensing device used for sensing capacitance, light, heat or ultrasonic waves, but not limited herein. The electronic device may include electronic elements such as passive elements and active elements, for example, capacitors, resistors, inductors, diodes, transistors, etc. It should be noted that the electronic device may be any arrangement and combination of the above, but not limited herein.

It should be noted that the technical features in different embodiments described in the following can be replaced, recombined, or mixed with one another to constitute another embodiment without departing from the spirit of the present disclosure.

Please refer to FIG. 1. FIG. 1 is a partial cross-sectional schematic diagram of an electronic device according to a first embodiment of the present disclosure. As shown in FIG. 1, an electronic device 100 according to a first embodiment of the present disclosure may include a protective layer 110, a circuit structure 120, a sensing element 130 and a control unit 140. The circuit structure 120 is disposed on the protective layer 110, and the circuit structure 120 surrounds the sensing element 130. The term "surround" referred in the present disclosure may mean that in a cross-sectional view of the electronic device 100, at least a portion of an element or layer that is surrounded is disposed in another element or layer, and in some embodiments, this another element or layer may further contact a side surface of the corresponding element or layer that is surrounded, but not limited herein. The circuit structure 120 may include a plurality of conductive layers 122 and a plurality of insulating layers 124 stacked in a direction Y, such as a conductive layer 122a, a conductive layer 122b, a conductive layer 122c, a conductive layer 122d, a conductive layer 122e, a conductive layer 122f, an insulating layer 124a, an insulating layer 124b, an insulating layer 124c, an insulating layer 124d and an insulating layer 124e, but not limited herein. The circuit structure 120 may be a redistribution layer (RDL), so as to redistribute the circuit. For example, the contact positions of the circuit may be changed or the fan-out area of the circuit may be increased through one or more metal wiring processes, but not limited herein. In the present disclosure, the direction Y may be a normal direction of the electronic device 100, which is opposite to a top-view direction of the electronic device 100, while a direction X may be parallel to a horizontal direction, which is parallel to a surface of the control unit 140 or the upper surface or lower surface of the protective layer 110, and the direction Y may be perpendicular to the direction X, but not limited herein. The conductive layer 122 may include metal materials such as titanium, copper, aluminum, tin, nickel, gold or silver or other suitable conductive materials. The conductive layer 122 may be a single metal layer or a stack of multiple metal layers. The insulating layer 124 may include organic materials or inorganic materials. The organic materials include, for example, polyimide (PI), photosensitive polyimide (PSPI), epoxy, Ajinomoto build-up film (ABF) or other suitable materials, but not limited herein. The inorganic materials include, for example, silicon oxide (SiOx), silicon nitride (SiNx) or other suitable materials, but not limited herein. The circuit structure 120 may further include active elements and/or passive elements, such as diodes, transistors, capacitors, resistors and/or inductors, which may be electrically connected to wires formed by the conductive layer 122. The transistor includes, for example, a thin film transistor (TFT), and the thin film transistor may include a gate, a source, a drain and a semiconductor layer, but not limited herein. For example, the circuit structure 120 may be a thin-film array substrate or include a driving circuit, but not limited herein.

The control unit 140 is disposed between the circuit structure 120 and the protective layer 110, and the control unit 140 is electrically connected to the sensing element 130. The term "disposed between . . . " referred in the present disclosure may mean that portions of the elements overlap with each other in the direction X or the direction Y, whether that the whole layers or the whole surfaces of the elements are overlap with each other. As shown in FIG. 1, the control unit 140 being disposed between the circuit structure 120 and the protective layer 110 may mean that the control unit 140, the circuit structure 120 and the protective layer 110 respectively have at least a portion overlapping with each other in the direction Y, and the arrangement of these overlapping portions in the direction Y is the protective layer 110, the control unit 140 and the circuit structure 120 in sequence.

According to this embodiment, the protective layer 110 surrounds the control unit 140, and the protective layer 110 contacts a surface of the circuit structure 120. For example, in a top view of the electronic device 100, the control unit 140 is located within the protective layer 110, or the protective layer 110 is located at the periphery of the control unit 140 and surrounds the control unit 140. Therefore, in a direction parallel to the upper surface or lower surface of the protective layer 110 (e.g., in the direction X), the protective layer 110 is located at both sides of the control unit 140, as shown in the cross-sectional view of FIG. 1. Furthermore, at least a portion of the control unit 140 may be disposed within the protective layer 110. For example, the protective layer 110 may contact the side surface and/or the lower surface of the control unit 140. In some embodiments, as shown in FIG. 1, the protective layer 110 may cover the lower surface of the control unit 140. In other embodiments, the lower surface of the control unit 140 is not covered by the protective layer 110. For example, the protective layer 110 may expose the lower surface of the control unit 140 by a grinding process, but not limited herein. The control unit 140 may include, for example, a driver integrated circuit (driver IC) or other suitable units that are able to generate control signals or have control elements, but not limited herein. In some embodiments, the control unit 140 may be an integrated circuit chip, but not limited herein. The circuit structure 120 may include an upper surface 120a and a lower surface 120b opposite to the upper surface 120a. The lower surface 120b of the circuit structure 120 may face the control unit 140, and the protective layer 110 may contact the lower surface 120a of the circuit structure 120. The protective layer 110 may be used to reduce the influence of moisture. The protective layer 110 may include, for example, epoxy, ceramic, epoxy molding compound (EMC), other suitable materials or combinations of the above materials, but not limited herein.

Figure 6:
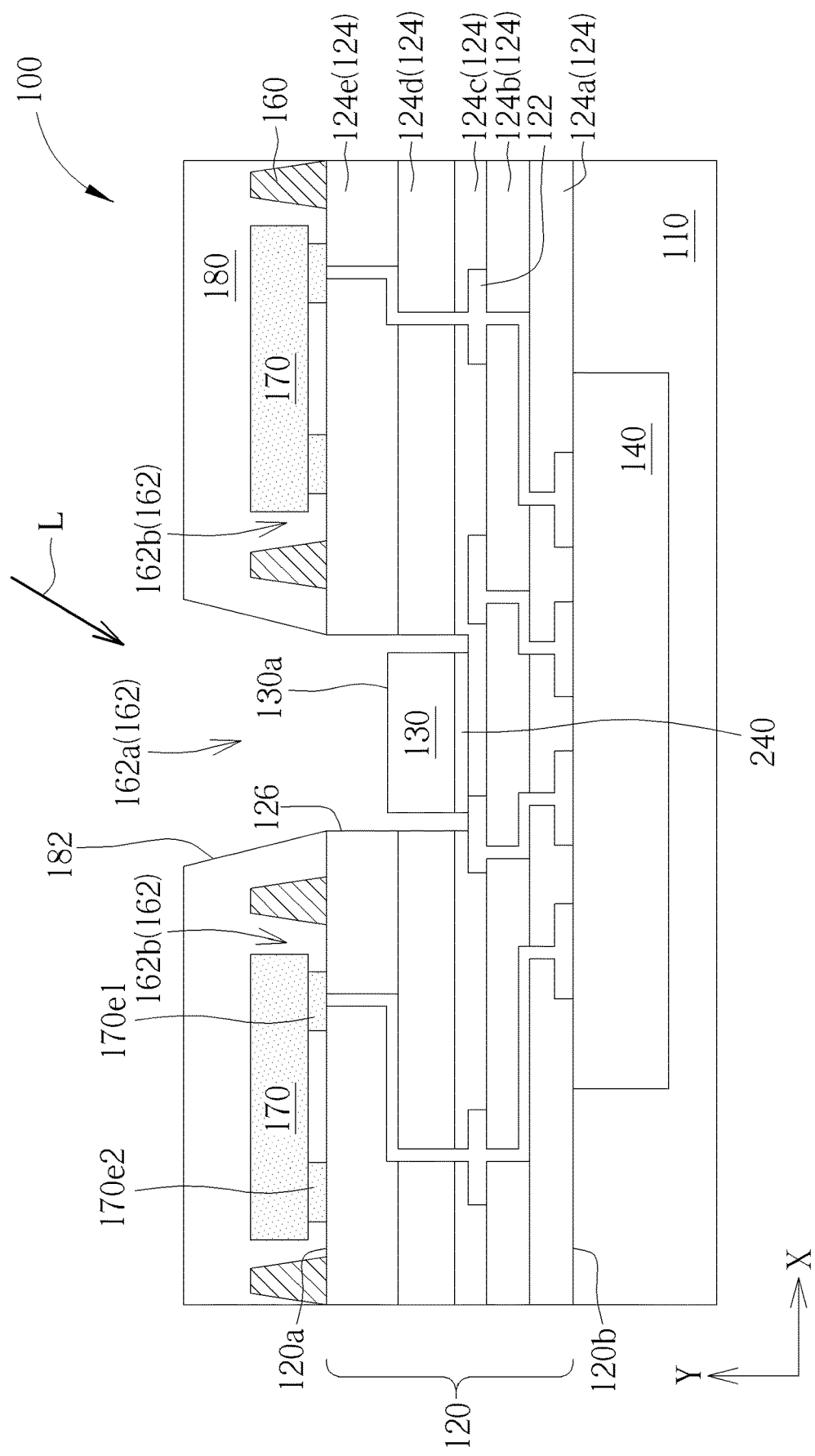
FIG. 6 is a partial cross-sectional schematic diagram of an electronic device according to a fifth embodiment of the present disclosure.

According to the embodiments of the present disclosure, at least a portion of the sensing element 130 may be disposed in the circuit structure 120. For example, the sensing element 130 may be integrally disposed in the circuit structure 120, and the circuit structure 120 may contact the side surface of the sensing element 130 (as shown in FIG. 1). Alternatively, the sensing element 130 may be partially disposed in the circuit structure 120, and the upper surface of the sensing element 130 is exposed (as shown in FIG. 6). The sensing element 130 may be, for example, a light sensor, a thermal sensor or a pressure sensor, and the light sensor includes, for example, a PIN diode, but not limited herein. In some embodiments, as shown in FIG. 1, the sensing element 130 may include an upper surface 130a and a side surface 130b connected to the upper surface 130a, and the upper surface 130a is opposite to the control unit 140. Furthermore, the circuit structure 120 may contact the side surface 130b of the sensing element 130. For example, the insulating layer 124 of the circuit structure 120 may contact the side surface 130b of the sensing element 130, and/or the insulating layer 124 of the circuit structure 120 may contact and cover the upper surface 130a of the sensing element 130. As shown in FIG. 1, the insulating layer 124 may circularly surround the sensing element 130 and contact any portion of the side surface 130b of the sensing element 130, but not limited herein.

In some embodiments, as shown in FIG. 1, the sensing element 130 and one of the conductive layers 122 of the circuit structure 120 may be disposed on the same insulating layer 124, that is, the sensing element 130 may be manufactured together with the circuit structure 120 to integrate the circuit structure 120 and the sensing element 130. Specifically, a conductive layer 122a, an insulating layer 124a, a conductive layer 122b, an insulating layer 124b, a conductive layer 122c, an insulating layer 124c, a conductive layer 122d, an insulating layer 124d, a conductive layer 122e, an insulating layer 124e and a conductive layer 122f that are patterned may be alternately formed in sequence in the direction Y. After the insulating layer 124c is formed on the conductive layer 122c, the conductive layer 122d may be formed on the insulating layer 124c, and the sensing element 130 may further be formed on the insulating layer 124c by, for example, an electroplating process, a thin-film process and/or a semiconductor process. That is to say, according to the electronic device 100 of this embodiment, the sensing element 130 and the conductive layer 122d may be disposed on the same insulating layer 124c, but not limited herein. In some embodiments, since the process temperature of forming the sensing element 130 is high and the organic materials are less able to withstand high temperature, the insulating layer 124a, the insulating layer 124b and the insulating layer 124c that are formed before forming the sensing element 130 may include inorganic materials for reducing the influence of the process temperature on the materials of the insulating layers, and the insulating layer 124d and the insulating layer 124e that are formed after forming the sensing element 130 may include organic materials, but not limited herein. The inorganic materials and the organic materials described above may be referred to the previous paragraphs, which will not be described redundantly herein.

The insulating layer 124 of the circuit structure 120 may cover the sensing element 130. For example, the insulating layer 124e may cover the upper surface 130a of the sensing element 130. Furthermore, the conductive layer 122 of the circuit structure 120 is not disposed above the sensing element 130, that is, there is no conductive layer 122 between the upper surface 130a of the sensing element 130 and the uppermost insulating layer 124e, so as to reduce the influence on the sensitivity or other electrical properties of the sensing element 130. In some embodiments, the insulating layer 124 above the sensing element 130 may have a high light transmittance. For example, the transmittance of the insulating layer 124 above the sensing element 130 may be greater than 70%, and the refractive index thereof may be greater than or equal to 1.1 and less than or equal to 1.6, which may, for example, prevent interface reflection, so as to improve the sensing quality of the sensing element 130, but not limited herein. In some embodiments, the insulating layer 124 may have the function of an anti-reflective layer (AR layer), which may be a single layer or a stack of materials with different refractive indices, for example. In some embodiments, the insulating layer 124 may have the function of a filter layer, which may allow light with a specific wavelength to pass through, so as to improve the sensing quality of the sensing element 130. In some embodiments, a hole may be formed in the insulating layer 124 on the upper side of the sensing element 130, so that the circuit structure 120 may expose the upper surface 130a of the sensing element 130. Therefore, light L may directly enter the sensing element 130 from the outside, thereby improving the sensing quality of the sensing element 130, but not limited herein.

Figure 2:
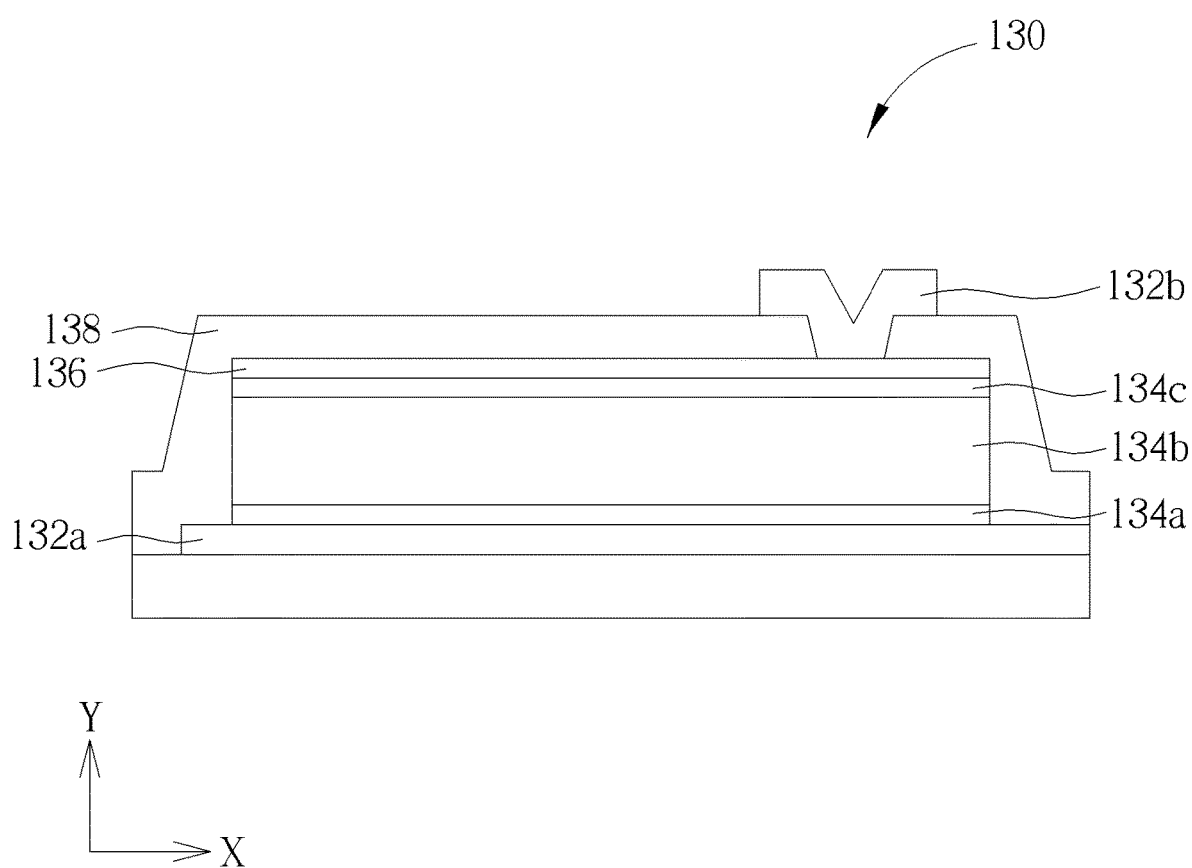
FIG. 2 is a partial cross-sectional schematic diagram of a sensing element according to an embodiment of the present disclosure.

As shown in FIG. 1, the control unit 140 may be electrically connected to the sensing element 130 through the circuit structure 120. For example, the control unit 140 may be electrically connected to an electrode of the sensing element 130 through the conductive layer 122a, the conductive layer 122b, the conductive layer 122c and the conductive layer 122d, but not limited herein. In some embodiments, as shown in FIG. 2, the sensing element 130 may include a PIN diode, wherein FIG. 2 is a partial cross-sectional schematic diagram of a sensing element according to an embodiment of the present disclosure. The sensing element 130 may include, for example, a first electrode 132a, a first semiconductor layer 134a (e.g., an N-type semiconductor layer), a second semiconductor layer 134b (e.g., an intrinsic semiconductor layer), a third semiconductor layer 134c (e.g., a P-type semiconductor layer) and a transparent electrode 136 (e.g., an indium tin oxide (ITO) electrode) which are stacked in the direction Y, and the first electrode 132a may be electrically connected to the conductive layer 122d. The sensing element 130 may further include a second electrode 132b, and the second electrode 132b may further pass through a connection hole of an insulating layer 138 and be disposed on the insulating layer 138. The insulating layer 138 is disposed on the transparent electrode 136, and the second electrode 132b is electrically connected to the transparent electrode 136 through the connection hole in the insulating layer 138. The insulating layer 138 may be regarded as a portion of the sensing element 130, or the insulating layer 138 may be regarded as a portion of the insulating layer 124 in the circuit structure 120. The first electrode 132a and the second electrode 132b may include, for example, metal materials or composite conductive materials, but not limited herein.

In some embodiments, as shown in FIG. 1, the circuit structure 120 may further include a patterned metal layer 150, the sensing element 130 is disposed on the patterned metal layer 150, and the patterned metal layer 150 may have a floating potential, but not limited herein. The patterned metal layer 150 may be disposed between the control unit 140 and the sensing element 130. In the normal direction Y of the electronic device 100, the patterned metal layer 150 may overlap the sensing element 130, such as completely shielding the lower surface of the sensing element 130, thereby reducing the influence of stray light on the sensing element 130. In some embodiments, the patterned metal layer 150 may be replaced by a light-shielding layer. The light-shielding layer may include, for example, metal materials, black photoresist materials or other materials with good light reflectivity and/or light absorption, but not limited herein.

In some embodiments, as shown in FIG. 1, the electronic device 100 may further include a light-shielding structure 160. The light-shielding structure 160 is disposed on the circuit structure 120 and has a plurality of openings 162, and one opening 162a of the plurality of openings 162 may correspond to the sensing element 130. The opening 162a of the light-shielding structure 160 exposes the sensing element 130. Further, the light-shielding structure 160 does not shield or overlap the sensing element 130 in the direction Y, so that the light L may enter the sensing element 130 through the opening 162a. The light-shielding structure 160 may include, for example, metal materials, black photoresist materials, opaque materials, organic materials or other materials with good light reflectivity and/or light absorption. The electronic device 100 may further include a function element 170, and the function element 170 is correspondingly disposed in another one opening 162b of the plurality of openings 162. The function element 170 may be electrically connected to the control unit 140 through the circuit structure 120. For example, the control unit 140 may be electrically connected to an electrode 170e1 of the function element 170 through the conductive layer 122a, the conductive layer 122b, the conductive layer 122c, the conductive layer 122d, the conductive layer 122e and the conductive layer 122f. Another electrode 170e2 of the function element 170 may be electrically connected to other circuits. For example, the electrode 170e2 may be electrically connected to a common electrode (not shown). The function element 170 may be, for example, a light-emitting element, an antenna element or other elements with specific functions required according to the product. The light-emitting element may include, for example, a light-emitting diode (LED), which may generate light T emitting to the outside, but not limited herein. The light-shielding structure 160 may, for example, reduce the influence of the light T emitted by the function element 170 on the sensing element 130, thereby reducing the influence of stray light. The function element 170 may not overlap the sensing element 130 in the direction Y. For example, the electronic device 100 may include two function elements 170, which are respectively disposed in two openings 162b of the plurality of openings 162, and the sensing element 130 may be located between the two function elements 170 when viewed in the direction Y. However, the number and arrangement of the function elements 170 and the corresponding openings 162b are not limited herein, which may be adjusted according to practical structural design of the device. In some embodiments, the electronic device 100 may further include an encapsulant layer 180. The encapsulant layer 180 covers the function element 170 and the light-shielding structure 160, and the encapsulant layer 180 may expose the region where the sensing element 130 is located. For example, the encapsulant layer 180 may have an opening 182 to expose a portion of the upper surface of the uppermost insulating layer 124e in the circuit structure 120. The opening 182 of the encapsulant layer 180 may correspond to the opening 162a of the light-shielding structure 160, and the size of the opening 182 may be less than the size of the opening 162a, but not limited herein. The encapsulant layer 180 may be, for example, a light-transmissive material, including epoxy, ceramic, other suitable materials or combinations of the above materials, but not limited herein.

According to the electronic device 100 of the embodiments of the present disclosure, the sensing element 130 and the function element 170 may be electrically connected to the same control unit 140 through the circuit structure 120, so that the control unit 140 may drive the sensing element 130 and the function element 170 simultaneously or in a time-division manner. That is to say, the sensing element 130 and the function element 170 may share the control unit 140, so that elements with various functions such as the sensing element 130 and the function element 170 may be integrated in the electronic device 100, thereby reducing the number of required control units 140. In some embodiments, the control unit 140 may be electrically connected to the sensing elements 130 located in a plurality of regions through the circuit structure 120, or the control unit 140 may be electrically connected to the function elements 170 located in a plurality of regions through the circuit structure 120, but not limited herein.

Some embodiments of the electronic devices of the present disclosure will be detailed in the following. In order to simplify the illustration, the same elements in the following would be labeled with the same symbols. The differences between different embodiments are described in detail below, and the same features would not be described redundantly. Each of the embodiments and another embodiment of the present disclosure may be combined and adjusted with each other.

Figure 3:
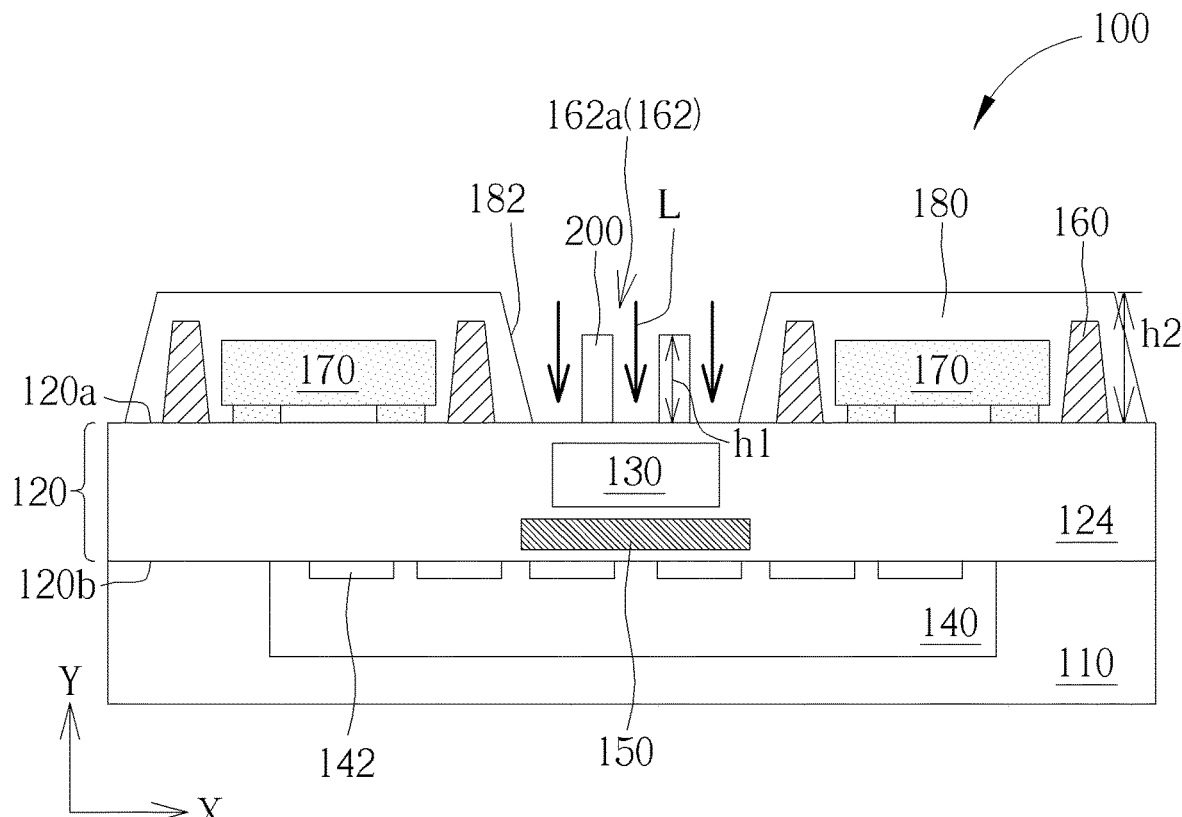
FIG. 3 is a partial cross-sectional schematic diagram of an electronic device according to a second embodiment of the present disclosure.

The manufacturing process of the electronic device 100 in the present disclosure may be, for example, a panel-level package (FOPLP) process, and may be a chip-first process or a RDL-first process, but not limited herein. Please refer to FIG. 3. FIG. 3 is a partial cross-sectional schematic diagram of an electronic device according to a second embodiment of the present disclosure, wherein the electronic device 100 shown in FIG. 3 may be manufactured by a chip-first process. In order to simplify the illustration, the conductive layers in the circuit structure 120 are omitted in FIG. 3 and the following FIG. 4, FIG. 5 and FIG. 7 to FIG. 10, and the entirety of multiple insulating layers in the circuit structure 120 is represented by an insulating layer 124. The configuration of multiple insulating layers 124 and multiple conductive layers 122 in the circuit structure 120 may be referred to, for example, FIG. 1, but not limited thereto. As shown in FIG. 3, an electronic device 100 according to a second embodiment of the present disclosure may further include one or plural collimator(s) 200, and the collimator 200 may be disposed in one opening 162a of the plurality of openings 162 and correspond to the sensing element 130.

Through the design of the collimator 200, the function of collimating the light L may be provided for the sensing element 130. According to different requirements of the signal-to-noise ratio (SNR), the light path of the light L entering the sensing element 130 may be approximately parallel to the normal direction Y, or have an included angle with the direction Y not greater than 60 degrees, not greater than 45 degrees or not greater than 30 degrees, thereby improving the accuracy of the sensing element 130. According to some embodiments, the collimator 200 has a first height h1, the encapsulant layer 180 has a second height h2, and the first height h1 is less than or equal to the second height h2. Further, a ratio of the first height h1 to the second height h2 (i.e., h1/h2) may be greater than or equal to 0.1 and less than or equal to 1. Through the above arrangement, the accuracy of the sensing element 130 may be improved or the cracking of the encapsulant layer 180 caused by the protruding collimator 200 may be reduced, but not limited herein. In the direction Y, the collimator 200 does not overlap at least a portion of the sensing element 130. Specifically, the collimator 200 may be disposed on the insulating layer 124 of the circuit structure 120, and the collimator 200 may be disposed in the opening 182 of the encapsulant layer 180. The opening 182 of the encapsulant layer 180 corresponds to the opening 162a of the light-shielding structure 160. The collimator 200 may include, for example, metal materials, black photoresist materials or other materials with good light reflectivity and/or light absorption, and the material of the collimator 200 may be the same as or different from the material of the light-shielding structure 160. In some embodiments, the circuit structure 120 may further include a patterned metal layer 150, and the sensing element 130 is disposed on the patterned metal layer 150. By disposing the patterned metal layer 150 corresponding to the sensing element 130, the leakage current may be reduced. The patterned metal layer 150 has a floating potential, for example, but not limited herein.

For example, in the manufacturing process of the electronic device 100 shown in FIG. 3, the protective layer 110 may be disposed around the control unit 140 to surround the control unit 140. Then, the circuit structure 120 is formed on the protective layer 110 and electrically connected to conductive pads 142 on the active surface of the control unit 140. The sensing element 130 may be manufactured together with the circuit structure 120. For example, the sensing element 130 is formed in the insulating layer 124 of the circuit structure 120 through a thin-film process and/or a semiconductor process. Then, the light-shielding structure 160, the collimator 200, the function element 170 and the encapsulant layer 180 may be formed on the circuit structure 120 subsequently, but not limited herein. The order of forming the function element 170, the light-shielding structure 160 and the collimator 200 may be adjusted according to the process design, as well as in other embodiments, which will not be redundantly described. In some embodiments, in order to reduce the influence of the high-temperature process of the sensing element 130 on the circuit structure 120, the sensing element 130 may be formed earlier, so that the sensing element 130 may be closer to the control unit 140. That is to say, the sensing element 130 may be closer to the lower surface 120b of the circuit structure 120 and farther away from the upper surface 120a of the circuit structure 120, but not limited herein.

Figure 4:
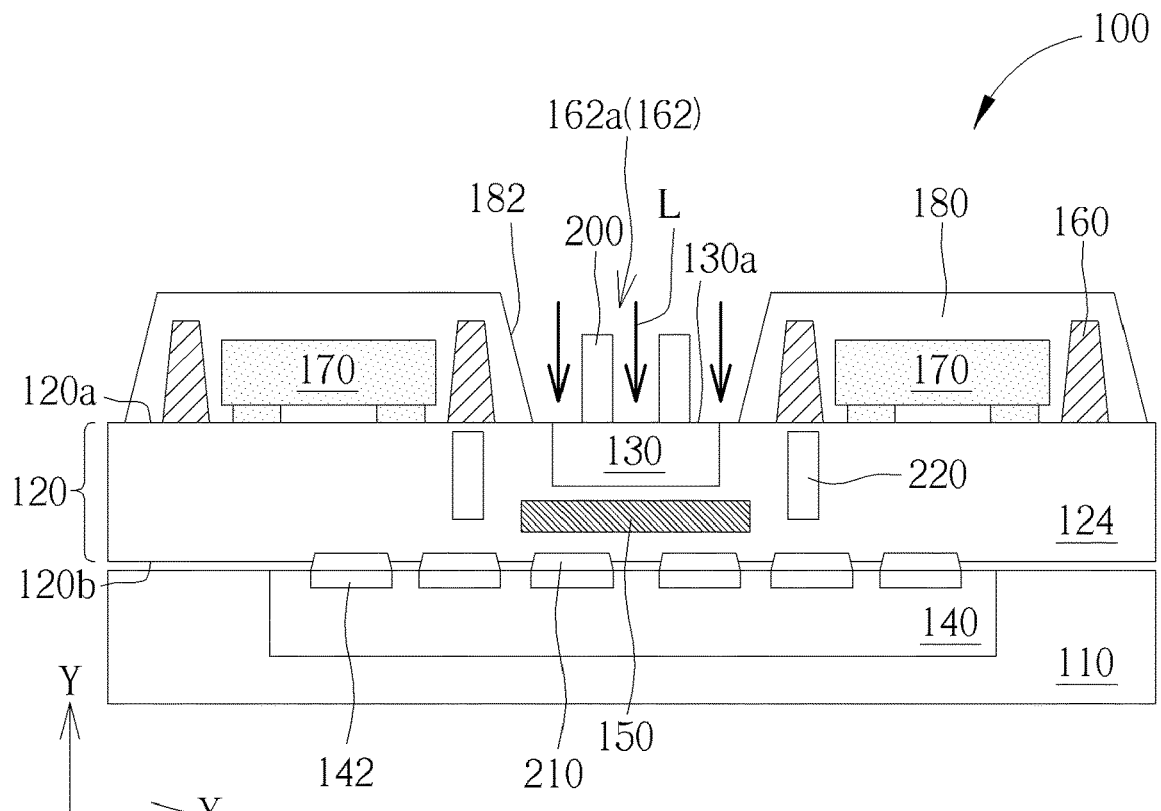
FIG. 4 is a partial cross-sectional schematic diagram of an electronic device according to a third embodiment of the present disclosure.

Please refer to FIG. 4. FIG. 4 is a partial cross-sectional schematic diagram of an electronic device according to a third embodiment of the present disclosure, wherein the electronic device 100 shown in FIG. 4 may be manufactured by a RDL-first process. As shown in FIG. 4, in an electronic device 100 according to a third embodiment of the present disclosure, the circuit structure 120 may expose the upper surface 130a of the sensing element 130. For example, the upper surface 130a of the sensing element 130 may be aligned with the upper surface 120a of the circuit structure 120. Therefore, the light L may directly enter the sensing element 130 from the outside without passing through the insulating layer 124 of the circuit structure 120 first, thereby improving the sensing quality of the sensing element 130. The collimator 200 may be disposed in one opening 162a of the plurality of openings 162 of the light-shielding structure 160 and correspond to the sensing element 130. For example, the collimator 200 may directly contact and be disposed on the upper surface 130a of the sensing element 130, but not limited herein. Specifically, the collimator 200 may be disposed in the opening 182 of the encapsulant layer 180, and the opening 182 of the encapsulant layer 180 corresponds to the opening 162a of the light-shielding structure 160. In addition, a plurality of bonding elements 210 may be disposed between the circuit structure 120 and the control unit 140, and the circuit structure 120 may be electrically connected to the conductive pads 142 of the control unit 140 through the bonding elements 210. The bonding element 210 may be, for example, under-bump metallization (UBM), a bump, a solder ball or a pad. The bonding element 210 may include copper, tin, nickel, gold, lead, other suitable conductive materials or combinations of the above materials, but not limited herein. In some embodiments, as shown in FIG. 4, the circuit structure 120 may further include a light-shielding element 220, and the light-shielding element 220 may be disposed at at least one side of the sensing element 130. For example, the light-shielding element 220 and the sensing element 130 do not overlap each other in the direction Y, or the sensing element 130 is disposed between two adjacent light-shielding elements 220. In some embodiments, the light-shielding element 220 may surround the sensing element 130, but not limited herein. The light-shielding element 220 may include, for example, metal materials, black photoresist materials or other materials with good light reflectivity and/or light absorption. The light-shielding element 220 may reduce the influence of the light emitted by the function element 170 on the sensing element 130, or may reduce the influence of side light or stray light in the environment on the sensing element 130, but not limited herein.

For example, in the manufacturing process of the electronic device 100 shown in FIG. 4, the circuit structure 120 and the sensing element 130 disposed in the circuit structure 120 may be formed first, so that the circuit structure 120 surrounds the sensing element 130. The bonding elements 210 may be formed when the circuit structure 120 is formed. Alternatively, the bonding elements 210 may be formed on the lower surface 120b of the circuit structure 120 or the upper surface of the control unit 140 when the control unit 140 is provided on the lower surface 120b of the circuit structure 120, so that the circuit structure 120 is electrically connected to the conductive pads 142 of the control unit 140 through the bonding elements 210, and then the protective layer 110 may be formed to surround the control unit 140. Then, after the whole structure is flipped upside-down, the light-shielding structure 160, the collimator 200, the function element 170 and the encapsulant layer 180 may be formed on the circuit structure 120 subsequently, but not limited herein.

Figure 5:
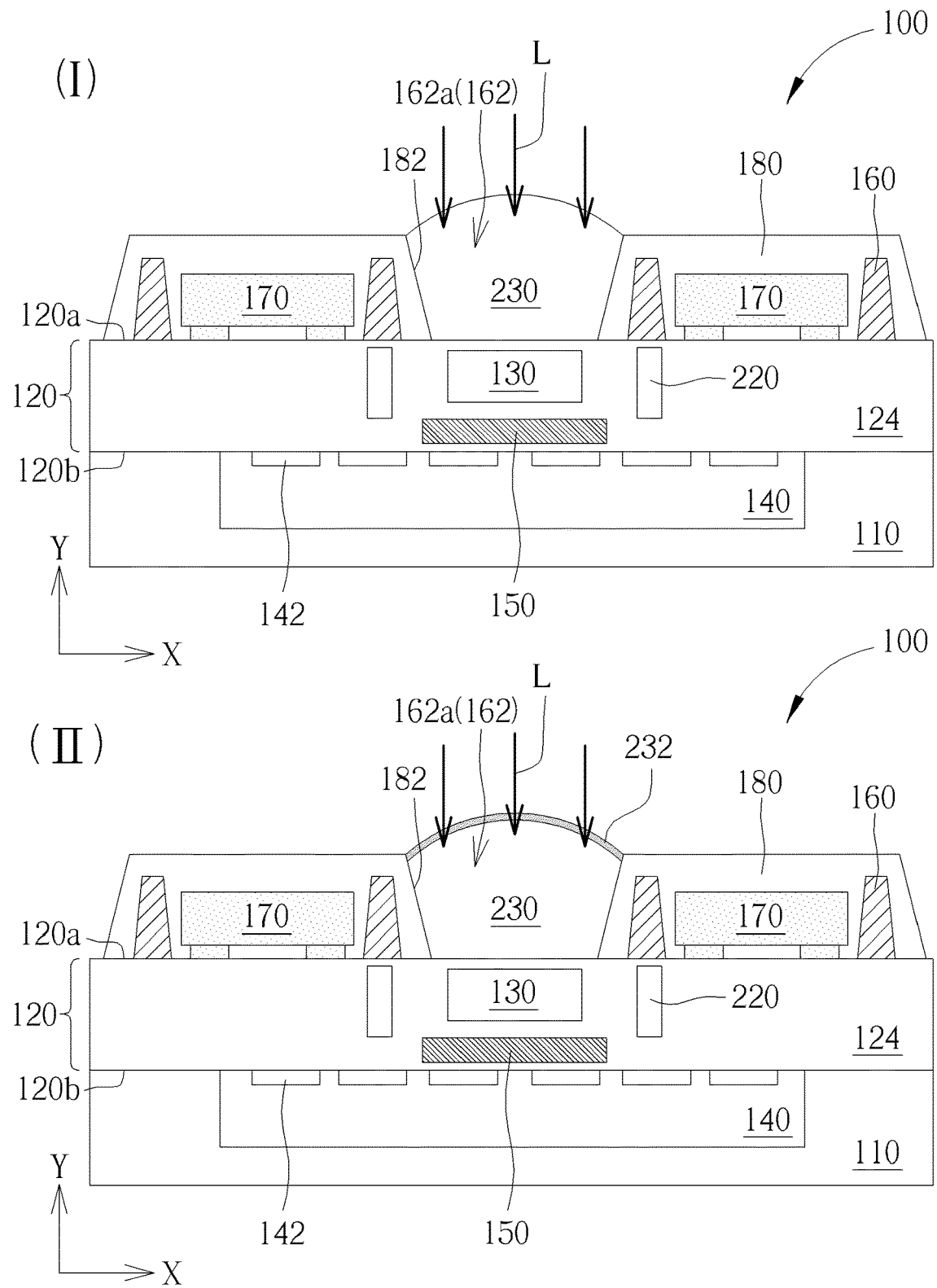
FIG. 5 is a partial cross-sectional schematic diagram of an electronic device according to a fourth embodiment and a variation embodiment thereof of the present disclosure.

Please refer to FIG. 5. FIG. 5 is a partial cross-sectional schematic diagram of an electronic device according to a fourth embodiment and a variation embodiment thereof of the present disclosure. As shown in an example (I) of FIG. 5, an electronic device 100 according to a fourth embodiment of the present disclosure may further include a lens 230, and the lens 230 is disposed in one opening 162a of the plurality of openings 162 and corresponds to the sensing element 130. The lens 230 may collimate or concentrate the light L, thereby improving the accuracy of the sensing element 130. For example, the center of the lens 230 or the thickest portion of the lens 230 may substantially correspond to the center of the sensing element 130, but not limited herein. Specifically, the lens 230 may be disposed on the insulating layer 124, and the lens 230 may be disposed in the opening 182 of the encapsulant layer 180. The opening 182 of the encapsulant layer 180 corresponds to the opening 162a of the light-shielding structure 160. As shown in an example (II) of FIG. 5, in an electronic device 100 according to a variation embodiment of the fourth embodiment of the present disclosure, the lens 230 further include a filter layer 232, so that the light L with a specific wavelength band enters the sensing element 130. The light L with a specific wavelength band may be, for example, infrared light, but not limited herein.

Please refer to FIG. 6. FIG. 6 is a partial cross-sectional schematic diagram of an electronic device according to a fifth embodiment of the present disclosure. As shown in FIG. 6, in an electronic device 100 according to a fifth embodiment of the present disclosure, the circuit structure 120 may have a groove 126, and the sensing element 130 is disposed in the groove 126. Specifically, the sensing element 130 may be a package element with a complete package structure. The sensing element 130 may be disposed in the groove 126 of the circuit structure 120, and a bonding element 240 may be further disposed between the circuit structure 120 and the sensing element 130. The sensing element 130 may be electrically connected to the conductive layer 122 of the circuit structure 120 through the bonding element 240, thereby being electrically connected to the control unit 140 through the conductive layer 122. The bonding element 240 may be, for example, a conductive adhesive or a conductive pad. The conductive adhesive includes, for example, an anisotropic conductive film (ACF), but not limited herein. When the conductive adhesive is used as the bonding element 240, the sensing element 130 may be fixed in the groove 126. The groove 126 may overlap the opening 162a of the light-shielding structure 160 in the direction Y, and the groove 126 may further overlap the opening 182 of the encapsulant layer 180 in the direction Y, so that the upper surface 130a of the sensing element 130 is exposed. Therefore, the light L may directly enter the sensing element 130 from the outside.

Figure 7:
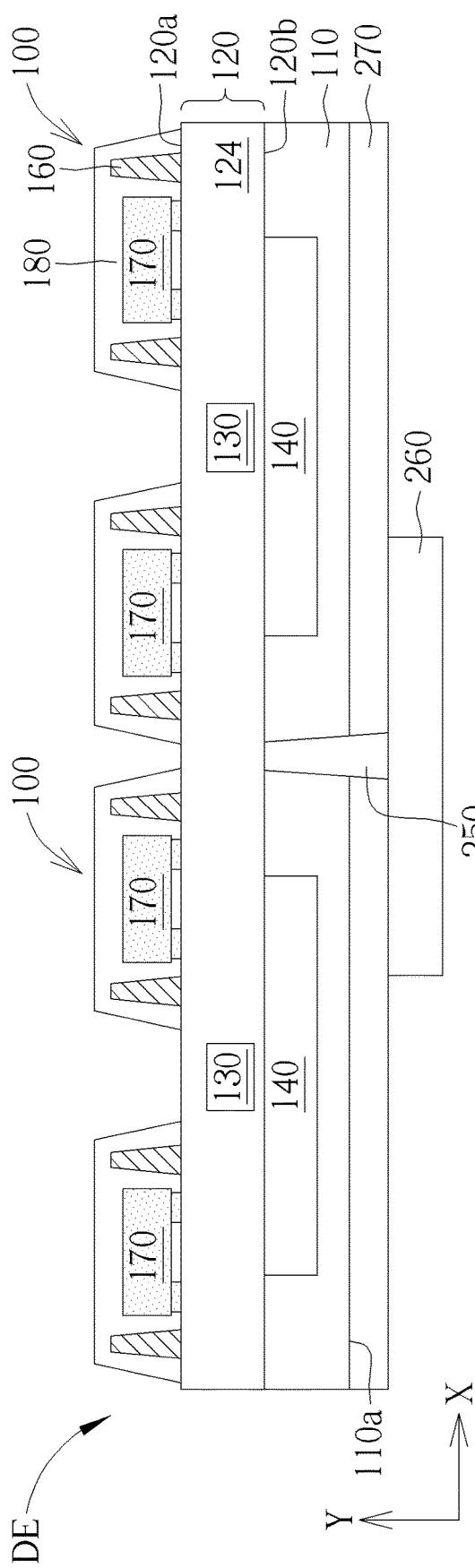
FIG. 7 is a partial cross-sectional schematic diagram of a tiled electronic device according to an embodiment of the present disclosure.
Figure 8:
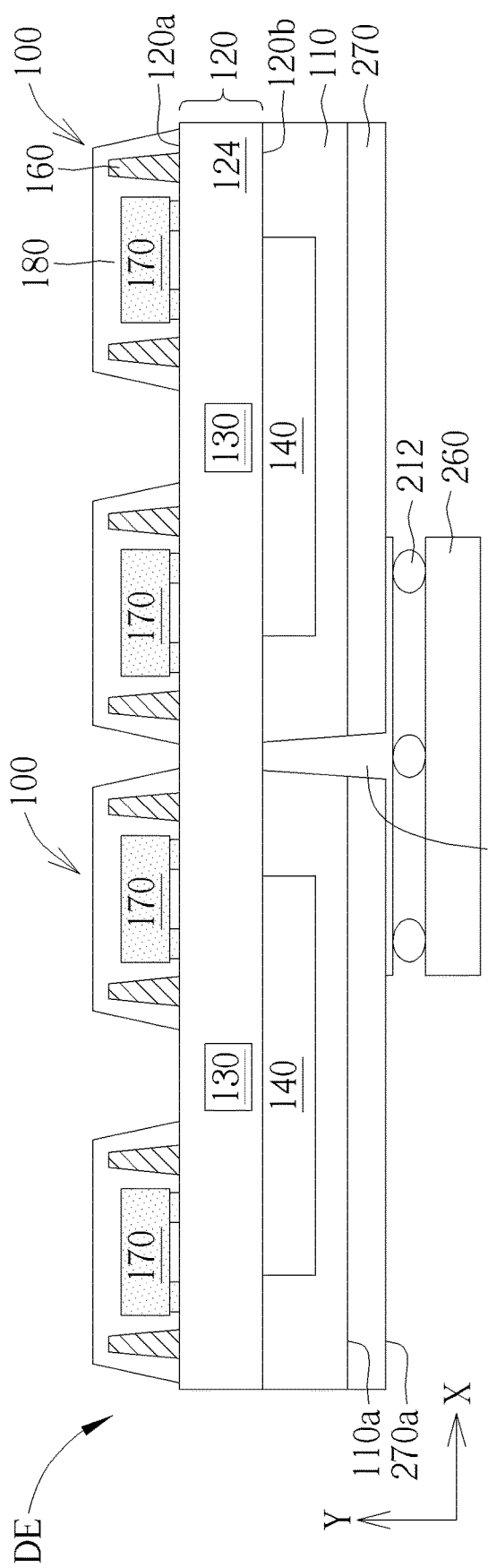
FIG. 8 is a partial cross-sectional schematic diagram of a tiled electronic device according to another embodiment of the present disclosure.

Please refer to FIG. 7 and FIG. 8. FIG. 7 is a partial cross-sectional schematic diagram of a tiled electronic device according to an embodiment of the present disclosure. FIG. 8 is a partial cross-sectional schematic diagram of a tiled electronic device according to another embodiment of the present disclosure. As shown in FIG. 7 and FIG. 8, a plurality of electronic devices 100 of the above embodiments of the present disclosure may be disposed adjacent to each other to form a tiled electronic device DE. For example, a tiled electronic device DE may include two electronic devices 100 and a connection unit 250. The two electronic devices 100 are disposed adjacent to each other, and each of the electronic devices 100 may include a protective layer 110, a circuit structure 120, a sensing element 130 and a control unit 140. In addition, each of the electronic devices 100 may further include a light-shielding structure 160, a function element 170 and an encapsulant layer 180, but not limited herein. The detailed structure and materials of each element of the electronic device 100 may be referred to the description of the above embodiments, which will not be described redundantly herein. The connection unit 250 may be disposed on one side (e.g., the lower side) of the circuit structure 120 of each of the two electronic devices 100 and electrically connected to the circuit structures 120 of the two electronic devices 100. In the embodiments shown in FIG. 7 and FIG. 8, the connection unit 250 may be located between the control units 140 of the two adjacent electronic devices 100 and between the protective layers 110 of the two adjacent electronic devices 100, and the connection unit 250 may contact the protective layers 110, but not limited herein. The connection unit 250 may include, for example, copper, tin, nickel, gold, lead, other suitable conductive materials or combinations of the above materials, but not limited herein.

As shown in FIG. 7 and FIG. 8, the tiled electronic device DE may further include a circuit board 260 and a protective layer 270. The protective layer 270 may cover the lower surface 110a of the protective layer 110 of each of the electronic devices 100, and the circuit board 260 may be disposed opposite to the protective layer 270. The circuit board 260 may include a printed circuit board (PCB), glass and/or polyimide, but not limited herein. The protective layer 270 may include, for example, epoxy, ceramic, epoxy molding compound (EMC), other suitable materials or combinations of the above materials, but not limited herein. The material of the protective layer 270 may be the same as or different from the material of the protective layer 110. The connection unit 250 is disposed between the protective layers 110 of the two electronic devices 100 in the direction X, and the circuit structures 120 of the two electronic devices 100 may be respectively electrically connected to the circuit board 260 through the connection unit 250. For example, the connection unit 250 may extend from the lower surfaces 120b of the two circuit structures 120 to pass through the protective layers 110 and the protective layer 270 and be electrically connected to the circuit board 260. In some embodiments, as shown in FIG. 7, the connection unit 250 may directly contact and be electrically connected to the circuit board 260. In some embodiments, as shown in FIG. 8, the connection unit 250 may extend to the lower surface 270a of the protective layer 270 and cover a portion of the lower surface 270a. Furthermore, a plurality of bonding elements 212 may be further disposed between the connection unit 250 and the circuit board 260, and the connection unit 250 may be electrically connected to the circuit board 260 through the bonding elements 212. The bonding element 212 may be, for example, a bump, a solder ball or a pad. The bonding element 212 may include copper, tin, nickel, gold, lead, other suitable conductive materials or combinations of the above materials, but not limited herein.

Figure 9:
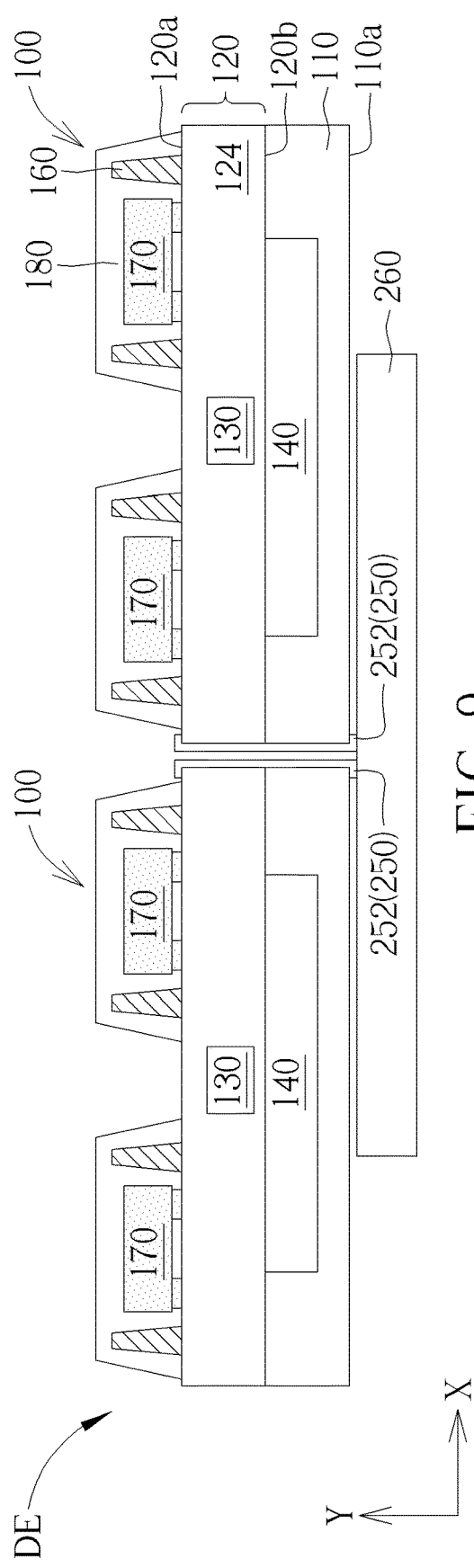
FIG. 9 is a partial cross-sectional schematic diagram of a tiled electronic device according to an embodiment of the present disclosure.

Please refer to FIG. 9. FIG. 9 is a partial cross-sectional schematic diagram of a tiled electronic device according to an embodiment of the present disclosure. As shown in FIG. 9, a tiled electronic device DE may include two electronic devices 100 disposed adjacent to each other and a connection unit 250, and the connection unit 250 may include two conductive elements 252. The two conductive elements 252 may be disposed between the two electronic devices 100, and each of the conductive elements 252 respectively corresponds to one electronic device 100 of the two electronic devices 100, that is, each of the conductive elements 252 may be correspondingly disposed on one side of one electronic device 100. Furthermore, each of the conductive elements 252 may respectively extend from the upper surface 120a of the circuit structure 120 of the corresponding electronic device 100 to the side surface of the circuit structure 120 and to the side surface and the lower surface 110a of the protective layer 110 of the corresponding electronic device 100. In some embodiments, the tiled electronic device DE may optionally include a circuit board 260. The circuit board 260 may be disposed opposite to the protective layers 110 of the two electronic devices 100, and each of the conductive elements 252 may be electrically connected to the circuit board 260, so that the circuit structure 120 of each of the electronic devices 100 is electrically connected to the circuit board 260 through the conductive element 252, but not limited herein. In other embodiments, the two conductive elements 252 may be directly connected to each other. The function of the conductive elements 252 may include leading the circuit from the front of the corresponding electronic device 100 (e.g., the upper surface 120a of the circuit structure 120) to the back of the corresponding electronic device 100 (e.g., the lower surface 110a of the protective layer 110) respectively, so that the circuit board 260 may be directly bonded to the conductive elements 252. In this embodiment, the conductive elements 252 may directly extend along the side surfaces of the corresponding circuit structure 120 and protective layer 110 respectively, which may be manufactured by, for example (but not limited to), a printing process or a coating process. The above design may make the distance between the two adjacent electronic devices 100 smaller, which may save the volume of the whole tiled electronic device DE, thereby improving the flexibility of space configuration of elements.

Figure 10:
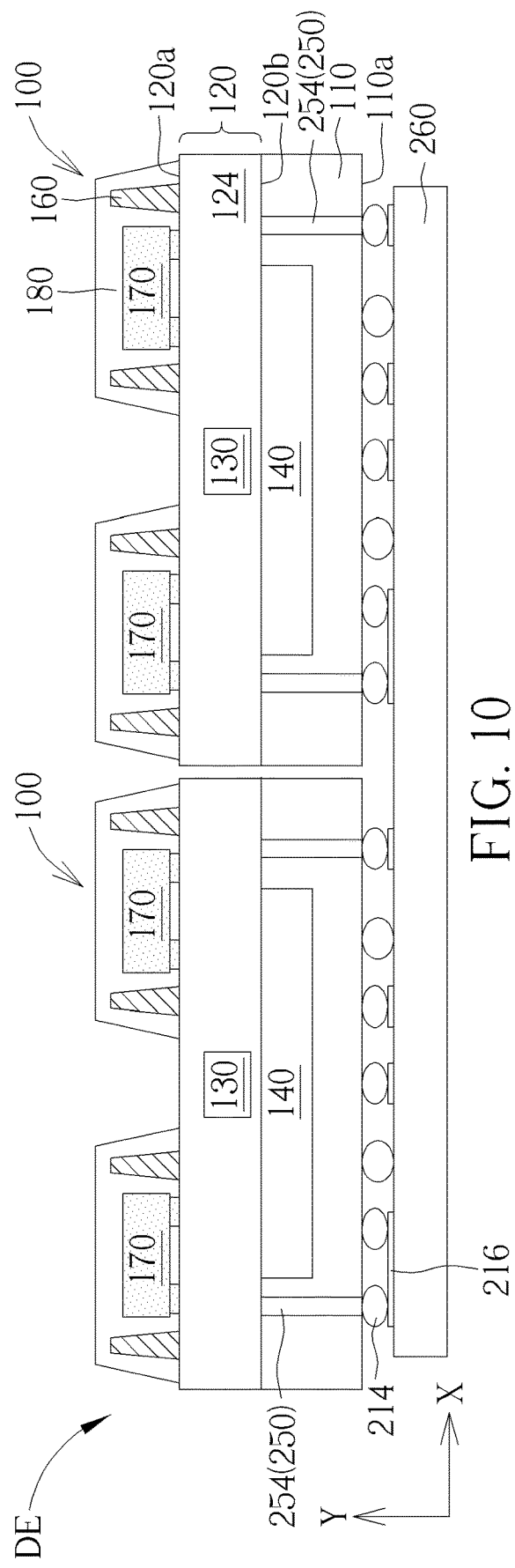
FIG. 10 is a partial cross-sectional schematic diagram of a tiled electronic device according to an embodiment of the present disclosure.

Please refer to FIG. 10. FIG. 10 is a partial cross-sectional schematic diagram of a tiled electronic device according to an embodiment of the present disclosure. As shown in FIG. 10, a tiled electronic device DE may include two electronic devices 100 disposed adjacent to each other, a connection unit 250 and a circuit board 260, and the connection unit 250 may include a plurality of conductive elements 254. Each of the plurality of conductive elements 254 respectively corresponds to one electronic device 100 of the two electronic devices 100. Furthermore, each of the plurality of conductive elements 254 may extend from the circuit structure 120 of the corresponding electronic device 100 and pass through the protective layer 110 of the corresponding electronic device 100 and be electrically connected to the circuit board 260. The plurality of conductive elements 254 may further achieve the function of heat dissipation. In some embodiments, a plurality of bonding elements 214 and a plurality of bonding elements 216 may be further disposed between the protective layer 110 of each of the electronic devices 100 and the circuit board 260, and the conductive elements 254 may be electrically connected to the circuit board 260 through the bonding elements 214 and the bonding elements 216. The bonding element 214 and the bonding element 216 may respectively be a bump, a solder ball or a pad, for example. The bonding element 214 and the bonding element 216 may respectively include copper, tin, nickel, gold, lead, other suitable conductive materials or combinations of the above materials, but not limited herein. In some embodiments, another circuit structure (not shown) may be disposed on another side of the protective layer 110 of each of the electronic devices 100, that is, the protective layer 110 may be disposed between the circuit structure 120 and another circuit structure, and the circuit structure 120 may be electrically connected to another circuit structure through the conductive elements 254, but not limited herein.

From the above description, according to the electronic devices and the tiled electronic devices of the embodiments of the present disclosure, through the structural design that the circuit structure such as the redistribution layer surrounds the sensing element, the circuit structure and the sensing element may be integrated, so that elements with various functions may be integrated in the electronic device. Therefore, a single electronic device may have various elements with different functions, such as simultaneously including the redistribution layer, the sensing element, the control unit, the function element, etc. The various elements with different functions may share one control unit in the electronic device, thereby reducing the number of control units. The design of integrating may achieve the effect of saving the space of the electronic device. In addition, according to the present disclosure, the manufacturing processes of the circuit structure and the sensing element may be integrated so as to be manufactured together, which may save the cost of the manufacturing process.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
    a protective layer;
    a circuit structure disposed on the protective layer and comprising a conductive layer, a first insulating layer and a second insulating layer, wherein the first insulating layer and the second insulating layer surround the conductive layer;
    a sensing element, wherein the circuit structure surrounds the sensing element;
    a control unit disposed between the circuit structure and the protective layer and electrically connected to the sensing element; and
    a metal layer disposed between the control unit and the sensing element, wherein the second insulating layer is disposed between the metal layer and the sensing element,
    wherein the protective layer surrounds the control unit, and the protective layer contacts a surface of the circuit structure,
    wherein the metal layer is overlapped with the sensing element, a width of the metal layer is greater than a width of the sensing element, and the conductive layer and the metal layer are disposed on a surface of the first insulating layer.

2. The electronic device according to claim 1, wherein the control unit is electrically connected to the sensing element through the circuit structure.

3. The electronic device according to claim 1, wherein the sensing element is a light sensor.

4. The electronic device according to claim 1, further comprising a light-shielding structure disposed on the circuit structure and having a plurality of openings, wherein one of the plurality of openings corresponds to the sensing element.

5. The electronic device according to claim 4, further comprising a collimator disposed in the one of the plurality of openings and corresponding to the sensing element.

6. The electronic device according to claim 4, further comprising a lens disposed in the one of the plurality of openings and corresponding to the sensing element.

7. The electronic device according to claim 6, wherein the lens comprises a filter layer.

8. The electronic device according to claim 4, further comprising a function element correspondingly disposed in another one of the plurality of openings and electrically connected to the control unit through the circuit structure.

9. The electronic device according to claim 8, further comprising an encapsulant layer covering the function element and the light-shielding structure.

10. The electronic device according to claim 9, further comprising a collimator disposed in the one of the plurality of openings and corresponding to the sensing element, wherein the collimator has a first height, the encapsulant layer has a second height, and the first height is less than or equal to the second height.

11. The electronic device according to claim 1, wherein metal layer has a floating potential.

12. The electronic device according to claim 1, wherein the sensing element comprises an upper surface opposite to the control unit, the circuit structure comprises a third insulating layer, and the third insulating layer covers the upper surface of the sensing element.

13. The electronic device according to claim 1, wherein the sensing element comprises an upper surface opposite to the control unit, and the circuit structure exposes the upper surface of the sensing element.

14. The electronic device according to claim 1, wherein the circuit structure comprises a light-shielding element disposed at at least one side of the sensing element.

15. The electronic device according to claim 1, wherein the circuit structure has a groove, and the sensing element is disposed in the groove.

16. A tiled electronic device, comprising:
two electronic devices disposed adjacent to each other, wherein each of the electronic devices comprises:
a protective layer;
a circuit structure disposed on the protective layer and comprising a conductive layer, a first insulating layer and a second insulating layer, wherein the first insulating layer and the second insulating layer surround the conductive layer;
a sensing element, wherein the circuit structure surrounds the sensing element;
a control unit disposed between the circuit structure and the protective layer and electrically connected to the sensing element, wherein the protective layer surrounds the control unit, and the protective layer contacts a surface of the circuit structure; and
a metal layer disposed between the control unit and the sensing element, wherein the second insulating layer is disposed between the metal layer and the sensing element, wherein the metal layer is overlapped with the sensing element, a width of the metal layer is greater than a width of the sensing element, and the conductive layer and the metal layer are disposed on a surface of the first insulating layer; and
a connection unit disposed on one side of the circuit structure of each of the two electronic devices and electrically connected to the circuit structures of the two electronic devices.

17. The tiled electronic device according to claim 16, further comprising a circuit board, wherein the connection unit is disposed between the protective layers of the two electronic devices, and the circuit structures of the two electronic devices are respectively electrically connected to the circuit board through the connection unit.

18. The tiled electronic device according to claim 16, wherein the connection unit comprises two conductive elements disposed between the two electronic devices, and each of the conductive elements respectively corresponds to one of the two electronic devices, wherein each of the conductive elements respectively extends from an upper surface of the circuit structure of the corresponding electronic device to a lower surface of the protective layer of the corresponding electronic device.

19. The tiled electronic device according to claim 16, further comprising a circuit board, wherein the connection unit comprises a plurality of conductive elements, and each of the plurality of conductive elements respectively corresponds to one of the two electronic devices, wherein each of the plurality of conductive elements extends from the circuit structure of the corresponding electronic device and passes through the protective layer of the corresponding electronic device and is electrically connected to the circuit board.

* * * * *